United States Patent
Ausserlechner et al.

(10) Patent No.: US 7,782,050 B2
(45) Date of Patent: Aug. 24, 2010

(54) HALL EFFECT DEVICE AND METHOD

(75) Inventors: Udo Ausserlechner, Villach (AT); Mario Motz, Weinberg (AT)

(73) Assignee: Infineon Technologies AG, Neubiberg (DE)

(*) Notice: Subject to any disclaimer, the term of this patent is extended or adjusted under 35 U.S.C. 154(b) by 97 days.

(21) Appl. No.: 12/101,271

(22) Filed: Apr. 11, 2008

(65) Prior Publication Data
US 2009/0256559 A1 Oct. 15, 2009

(51) Int. Cl.
G01R 33/07 (2006.01)
H01L 27/22 (2006.01)

(52) U.S. Cl. .......... 324/251; 257/427; 257/E43.002; 257/E43.007

(58) Field of Classification Search .......... 324/207.2, 324/251; 338/32 R, 32 H; 257/421–427, 257/E43.002, E43.007; 365/7–9, 170
See application file for complete search history.

(56) References Cited

U.S. PATENT DOCUMENTS 5,572,058 A 11/1996 Biard
2008/0074106 A1* 3/2008 Oohira ............... 324/209
2008/0188045 A1* 8/2008 Morris ............... 438/217

OTHER PUBLICATIONS

R. Steiner et al., In-Plane Sensitive Vertical Trench-Hall Device, IEDM, 1998, pp. 479-482.
R. Sunier et al., Quasi-Analytical Study of Offset Voltage Due to Piezoresistive Effect in Vertical Hall Devices by Mapping Techniques, IEEE, 2003, pp. 1582-1585.
R. Steiner Vanha et al., Trench-Hall Devices, Journal of Microelectromechanical Systems, vol. 9, No. 1, Mar. 2000, pp. 82-87.

* cited by examiner

Primary Examiner—Bot L LeDynh
(74) Attorney, Agent, or Firm—Dicke, Billig & Czaja, PLLC

(57) ABSTRACT

A semiconductor device including a Hall effect sensor and related method. The Hall effect device includes a substrate having a first conductivity type and an epitaxial layer having a second conductivity type defining a Hall effect portion. A conductive buried layer having the second conductivity type is situated between the epitaxial layer and the substrate. First and second output terminals and first and second voltage terminals are provided, with the second voltage terminal being coupled to the conductive buried layer.

28 Claims, 7 Drawing Sheets

HALL EFFECT DEVICE AND METHOD

BACKGROUND

A Hall effect sensor is a device that varies its output voltage in response to changes in magnetic field, and are used in applications such as positioning and position detection, proximity switching, speed detection, current sensing, etc. Hall effect devices are often implemented in integrated circuit semiconductor devices.

Vertical Hall devices are used to measure magnetic field components parallel to the surface of semiconductor device embodying the sensor. Many different geometries are known for such devices, and they can be implemented through ordinary CMOS technologies. High voltage technologies increasingly make use of a highly conductive n-buried layer (nBL), which cannot be blanked out in the standard technology flow. This nBL can be problem for vertical Hall devices, because it shorts the bottom end of the Hall probe, decreasing magnetic sensitivity of the probe (magnetic sensitivity is the ratio of output voltage to magnetic field strength).

SUMMARY

A semiconductor device including a Hall effect sensor and related method are disclosed. The Hall effect device includes a substrate having a first conductivity type and an epitaxial layer having a second conductivity type defining a Hall effect portion. A conductive buried layer having the second conductivity type is situated between the epitaxial layer and the substrate. First and second output terminals and first and second voltage terminals are provided, with the second voltage terminal being coupled to the conductive buried layer.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
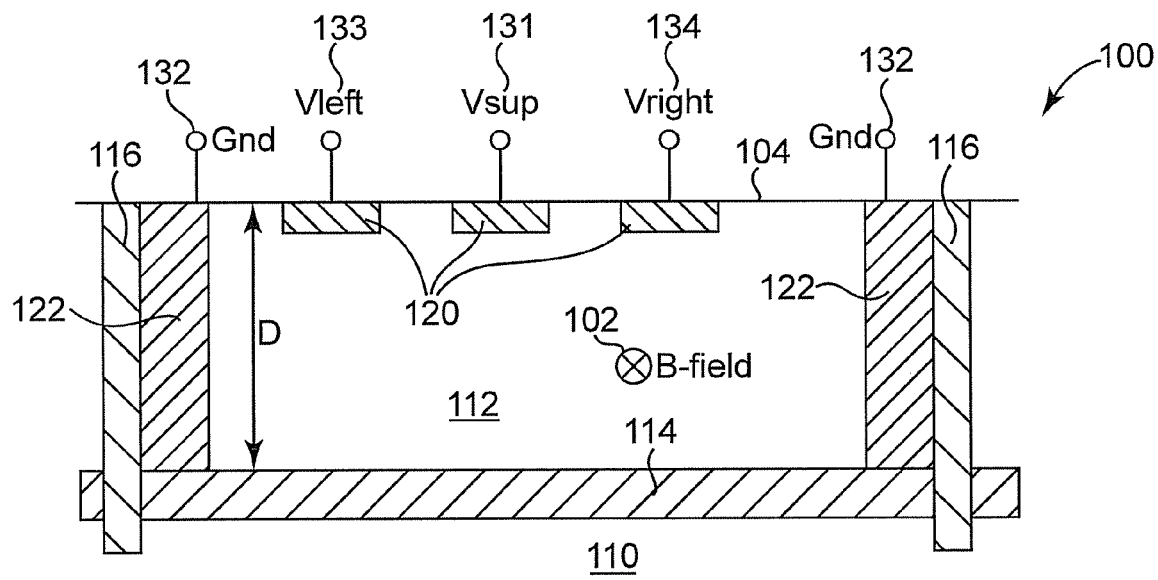
FIG. 1 is a schematic cross-section view conceptually illustrating an embodiment of a Hall effect device.
Figure 2:
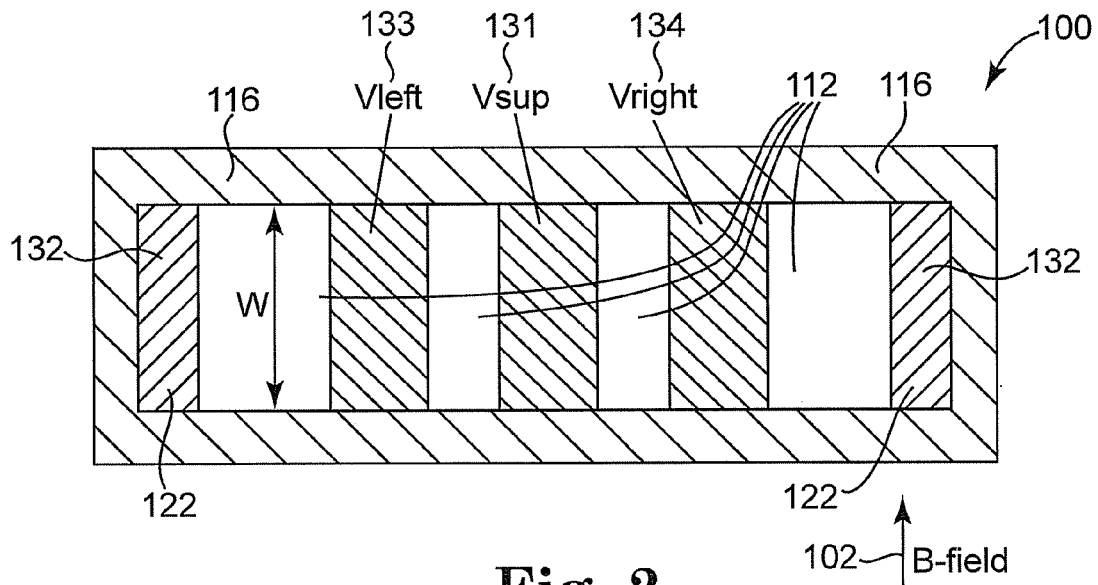
FIG. 2 is a schematic top view conceptually further illustrating the embodiment of FIG. 1.

FIG. 1 is schematic cross-section view and FIG. 2 is a top view, conceptually illustrating an embodiment of a Vertical Hall device 100 implemented as an integrated circuit semiconductor device. The Vertical Hall device 100 arranged to sense a magnetic field (B-field) 102 extending generally parallel to the surface 104 of the device 100—in other words, the B-field 102 extends in-and-out of the page as viewed in FIG. 1 and extends in the direction of the arrow 102 illustrated in FIG. 2.

The Vertical Hall device 100 includes a p-type semiconductor substrate 110 with an n-type epitaxial layer/n-Hall effect portion 112 on the p-type substrate 110. An n-type conductive buried layer (nBL) 114 is situated between the n-type epitaxial layer 112 and the p-type substrate 110. An isolation structure, such as a Polycrystalline Silicon (Poly Si) trench 116 surrounds the Hall portion 112. In other embodiments, other suitable isolation structures are used in place of the Poly Si trench 116, such as deep p-diffusions.

A plurality of conductive terminals are coupled to the Hall effect portion 112. For example, four or more terminals 131, 132, 133, 134 are included. In the illustrated embodiment, the first and second terminals 131, 132 are voltage/current input terminals and the second and third terminals 133, 134 are output terminals. In FIGS. 1 and 2, the n-type epitaxial layer 112 contains a plurality of n-CMOS wells that form $n^+$ source/drain structures 120, to which conductive contacts are coupled to provide the first input terminal 131 ($V_{sup}$), and the output terminals 133, 134 ($V_{left}$ and $V_{right}$). In operation, the first and second terminals 131,132 will be connected to different voltage potentials. Typically, one is connected to a supply voltage and the other to ground. In the illustrated embodiment, the second terminals 132 are ground terminals (Gnd) and are connected to the nBL 114 by a conductive member 122 such that the nBL 114 functions as a terminal. The nBL 114 can be connected to the terminal 132 by deep collector diffusions 122, or by another suitable connection such as n-CMOS wells. In other embodiments, the functions of the terminals are reversed, such that the first and second terminals 131,132 are exchanged so that the second terminals 132 connected to the nBL 114 function as the voltage supply ($V_{sup}$) terminals, with the first terminal 131 connected to ground.

Current is passed through the device 100 vertically by connecting the terminals 131,132 to a voltage/current source and ground, respectively. Thus, the nBL 114 is connected to ground via the deep collector diffusions 122 and Gnd terminals, with the $V_{sup}$ terminal connected to the supply voltage/ current. This can be referred to as the vertical current mode. Under the action of the B-field 102, the output terminals 133,134 ($V_{left}$ and $V_{right}$) will be at slightly different voltages. The output voltage of the Vertical Hall device 100 is the difference between the output terminals, $V_{right}-V_{left}$.

If the deep collector diffusions 122 are too near the output terminals 133,134 ($V_{left}$, $V_{right}$) they could short circuit a part of the output signal. Thus, the distance between the deep collector diffusions 122 and the nearest output terminal $V_{left}$ or $V_{right}$ should not be less than the vertical depth D or the width W of the Hall portion 112. Further, in the illustrated embodiment, all of the contact regions extend to the Poly Si trench 116 (all contacts have the same width W as the epitaxial layer 112), though in other embodiments the contact areas could have varying widths. For reasons of symmetry, the collector diffusions 122 are located on opposite sides of the Hall portion 112. The width W dimension scales current consumption (and therefore noise) of the device 100, and thus is sized based on the particular application.

Figure 3:
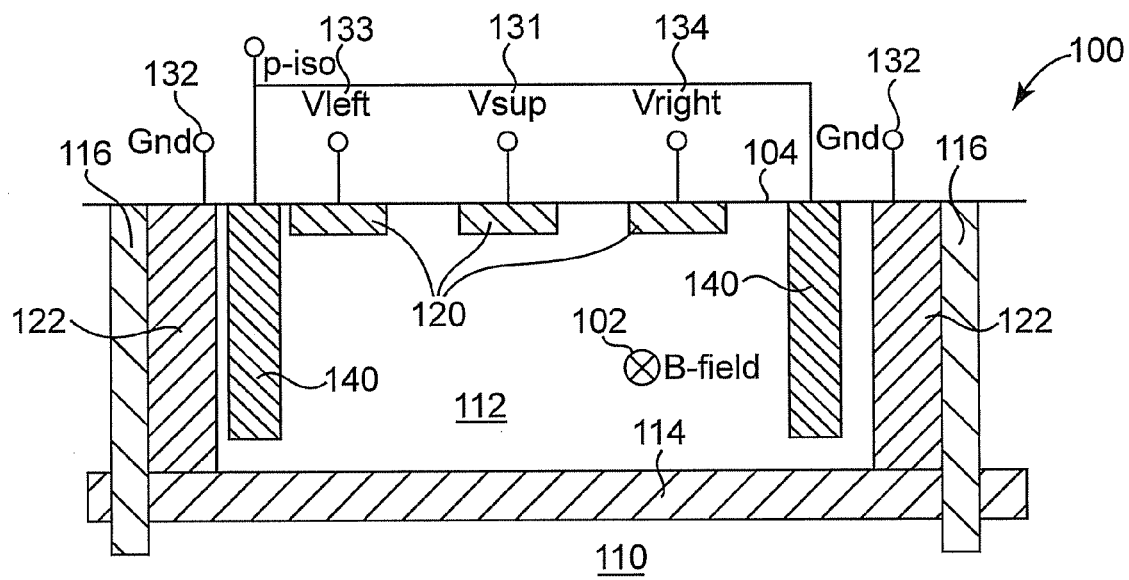
FIG. 3 is a schematic cross-section view conceptually illustrating an embodiment of a Hall effect device.

FIG. 3 is schematic cross-section view conceptually illustrating an embodiment of a Vertical Hall device 100. To reduce short-circuit effects of the connections 122 to the nBL 114, an additional isolation structure is provided. In the embodiment illustrated in FIG. 3, a deep p-isolation 140 is introduced between the deep collector diffusions 122 and the output voltage terminals 133,134 ($V_{left}$, $V_{right}$). In some embodiments, the isolation 140 extends to the nBL 114. In the embodiment illustrated in FIG. 3, it does not extend all the way to the nBL 114, but it narrows the n-type epitaxial layer 112 significantly. The p-isolation 140 is coupled to the lowest potential in the Hall device 100 or lower (to ground).

In some embodiments, a "spinning current" technique is used, where the supply and output terminals are alternated in subsequent clock phases. If the output signals are added over two successive clock phases, the Hall device's offset is cancelled or at least greatly reduced, while the signal of use (which is proportional to the magnetic field) is doubled. This principle works well with ordinary flat Hall plates; however, Vertical Hall devices do not have as high a degree of symmetry.

Figure 4:
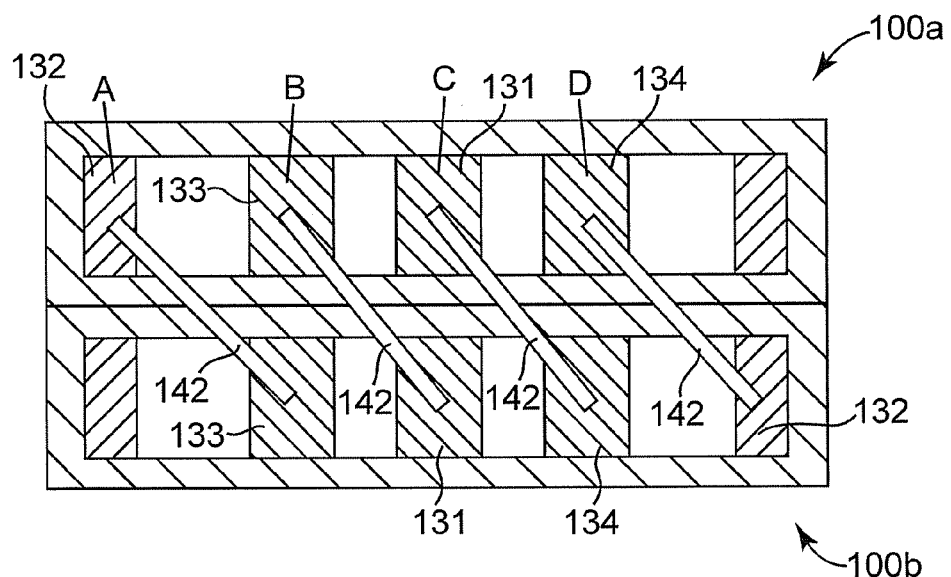
FIG. 4 is a schematic top view conceptually illustrating an embodiment of a Hall effect device.

To compensate for this, two Vertical Hall devices can be connected in parallel, where the first device is in a vertical current phase while the second device is in a horizontal current phase. A "parallel connection" of the Vertical Hall devices means that respective contacts of the two devices are shorted together. If the voltage supply and output terminals are exchanged, the first Vertical Hall device is in the horizontal current phase while the second one is in the vertical current phase. FIG. 4 illustrates an example of such an arrangement, in which first and second Vertical Hall devices 100a, 100b are provided. The illustrated devices 100a, 100b are similar to the embodiment illustrated and disclosed in conjunction with FIGS. 1 and 2, with the contacts shorted together with conductive members 142 in the manner illustrated. The first terminal 131 of the first Hall effect device 100a is coupled to the fourth terminal 134 of the second Hall effect device 10b, the second terminal 132 of the first Hall effect device 100a is coupled to the third terminal 133 of the second Hall effect device 10b, the third terminal 133 of the first Hall effect device 100a is coupled to the first terminal 131 of the second Hall effect device 100b, and the fourth terminal 134 of the first Hall effect device 100a is coupled to the second terminal 132 of the second Hall effect device 100b.

In FIG. 4, the effective terminals resulting from the connected devices 100a, 100b are labeled A-D going left to right across the drawing page. In a first clock phase the voltage/ current supply terminals are terminals A and C, and in a second clock phase terminals B and D function as the supply terminals. The other terminals function as the output terminals—thus, in the first clock phase the output terminals are terminals B and D, and in the second clock phase the output terminals are terminals A and C.

Figure 5:
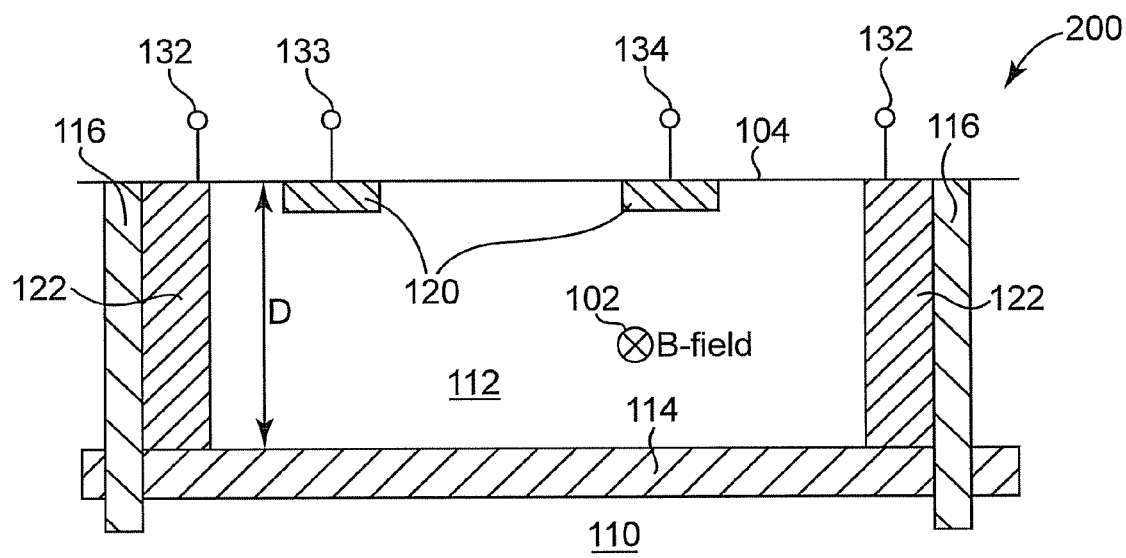
FIG. 5 is a schematic cross-section view conceptually illustrating an embodiment of a Hall effect device.
Figure 6:
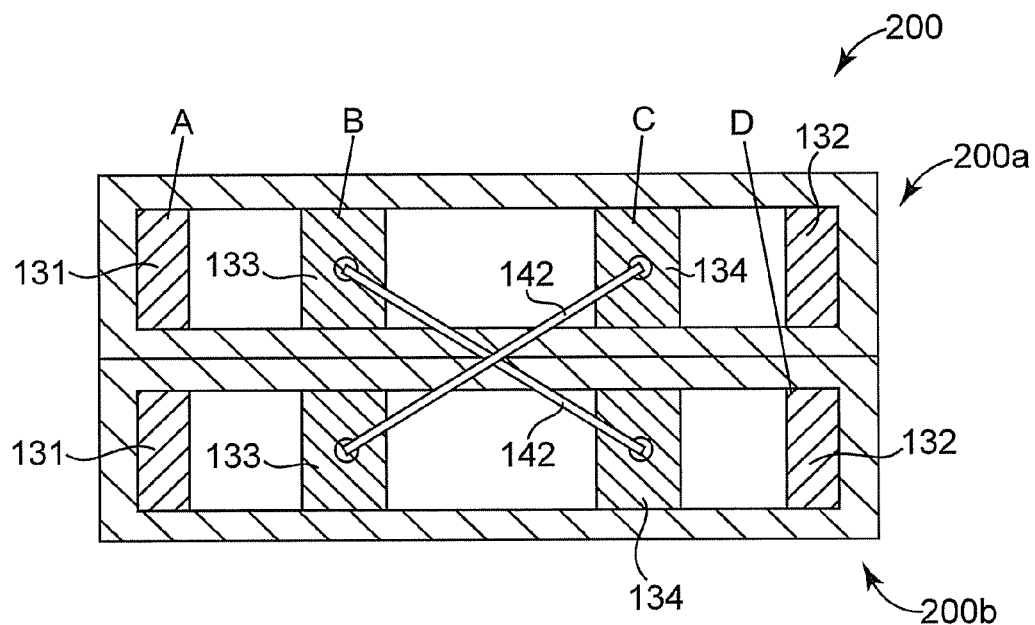
FIG. 6 is a schematic top view conceptually further illustrating the embodiment of FIG. 5.

FIGS. 5 and 6 illustrate an embodiment of an embodiment of a Vertical Hall device 200. The cross-section view illustrated in FIG. 5 is similar to the embodiment illustrated in FIG. 1, though the embodiment of FIG. 5 does not have the $V_{sup}$ terminal situated in the center of the device as in the embodiment illustrated in FIGS. 1 and 2. FIG. 6 illustrates a top view, with the two Vertical Hall devices 200a and 200b coupled together with conductive members 142 to form effective terminals labeled A-D going left to right across the drawing page. The third and fourth terminals 133,134 of the devices 200a, 200b are cross-coupled, such that the third terminal 133 of the first device 200a is coupled to the fourth terminal 134 of the second device 200b, and the fourth terminal 134 of the first device 200a is coupled to the third terminal 133 of the second device 200b.

Current is passed through the device vertically by connecting terminal A (the first terminal 131 of the first device 200a) to ground and the supply voltage/current to terminal D (the second terminal 132 of the second device 200b). Under the action of the B-field 102, the output terminals B and C will be at slightly different voltages. The output voltage of the combined devices 200a, 200b is the difference between the voltages at the output terminals B and C.

As with the embodiment illustrated in FIGS. 1 and 2, if the deep collector diffusions 122 are too near the output terminals 133,134 they could short circuit a part of the output signal. The distance between the deep collector diffusions 122 and the nearest output terminal 133,134 should therefore not be less than the vertical depth D or the width W of the Hall portion 112. For reasons of symmetry, the collector diffusions 122 are located on opposite sides of the Hall portion 112. The width W dimension scales current consumption (and therefore noise) of the device 200, and thus is sized based on the particular application.

Figure 7:
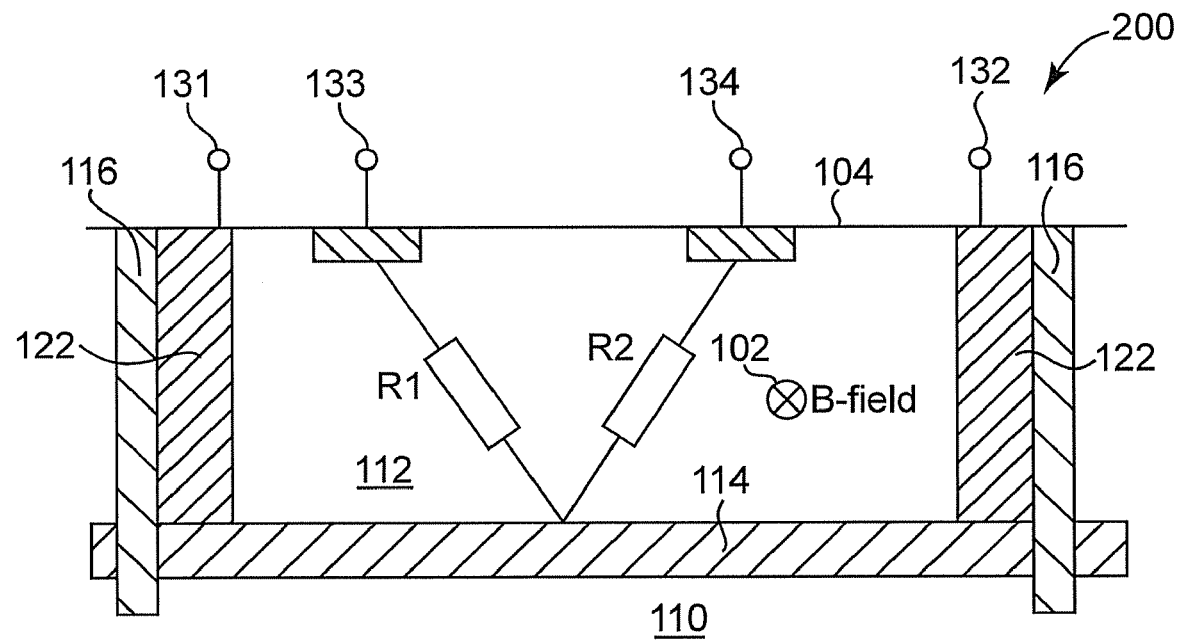
FIG. 7 is a schematic cross-section view illustrating equivalent resistances of the embodiment of FIG. 5.

If a current were to pass vertically from the nBL 114 up to the output terminals B, C in a zero magnetic field, the current would be divided into two equal parts, assuming terminals B and C are symmetric with respect to the nBL 114. This is referred to as the vertical current mode. Under the action of a magnetic field 102 normal to the direction of current, the division of the current would be slightly biased towards terminal B or C, depending on the sign of the magnetic field so that terminals B and C are at different potentials. In the second device 200b, the direction of the current is still vertical, however, with different polarity. Thus, in the device 200b the bias of terminals B and C is exactly opposite to the bias in the first device 200a. Terminal B of device 200a is coupled to terminal C of the second device 200b, and terminal C of the first device 200a is coupled to terminal B of the second device 200b in order to enhance the signals and not to cancel them. The entire current flows over the terminals B and C because there is no direct connection of the n-type epitaxial layers 112 of the first and second Hall devices 200a, 200b. The structure thus resembles an H-bridge with four resistances: Two resistances make up the first device 200a while the other two resistances constitute the second 200b. Therefore, the structure illustrated in FIGS. 5 and 6 can be referred to as a vertical Hall bridge. These resistances R1, R2 of the first device 200a are illustrated diagrammatically in FIG. 7, and a whole equivalent circuit is illustrated in FIG. 8.

Figure 8:
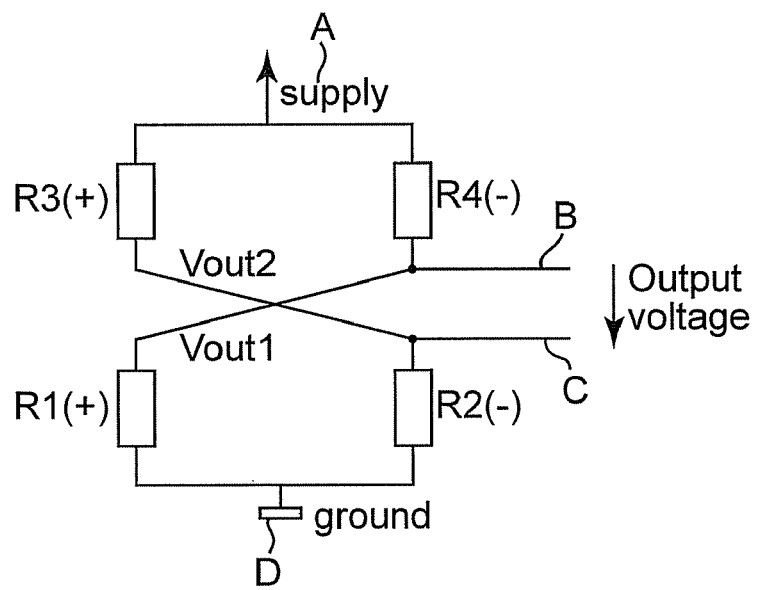
FIG. 8 is an equivalent circuit diagram illustrating an H-bridge configuration.

The equivalent circuit 300 illustrated in FIG. 8 includes four resistors R1, R2, R3, R4 arranged in an H-bridge configuration. The resistors include (+) or (−) signs to indicate which increase and which decrease with the magnetic field. The four resistances are illustrated as a convenient way to describe the voltage potential of the structure. In reality, R1 and R2 are not separate resistances since they are both in the same n-type epitaxial layer/Hall domain 112 domain of the respective Hall device. Thus, it is not the magneto-resistive effect that makes the device work, but rather, it is the Hall-effect that diverts the current lines to one of the two output contacts B, C, thereby establishing a small output voltage between the output contacts.

Figure 9:
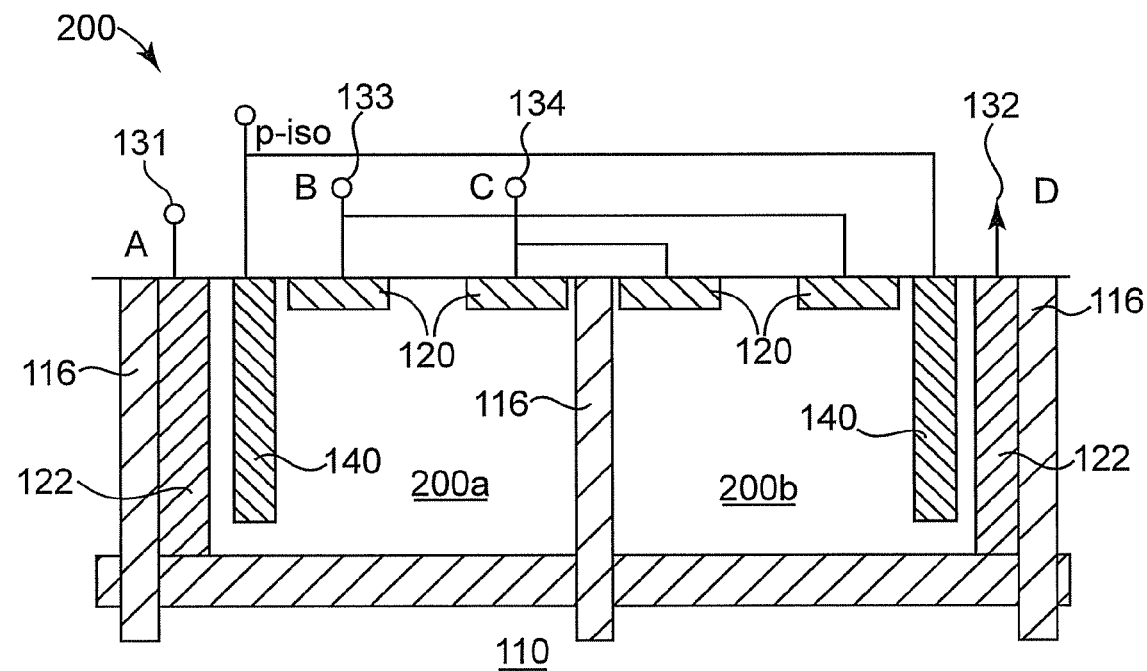
FIG. 9 is a schematic cross-section view conceptually illustrating an embodiment of a Hall effect device.

FIG. 9 illustrates an embodiment where the two Hall devices 200a, 200b are situated side by side. The embodiment illustrated in FIG. 9 further includes a p-isolation 140, which reduces the short-circuiting effects of the deep collector diffusions 122 on the Hall device. In another embodiment, four of the Vertical Hall devices are used. Two sets of the devices 200, with first and second devices 200a, 200b situated side by side as illustrated in FIG. 9 are coupled together in the manner illustrated in FIG. 6.

Alternatively, it is also possible to inject current into one of the output terminals B or C while holding the other output terminal tied to ground, and taking the Hall output voltage between the two nBLs 114, in effect using the terminals A and D as output terminals. This may be used in order to implement the spinning current Hall probe techniques in order to reduce or cancel the offset of the Hall device.

In another embodiment, the Vertical Hall devices are implemented as differential field sensors. A Vertical Hall bridge is situated at one side of a semiconductor die and another Vertical Hall bridge is situated at the other side of the die to sense the difference in magnetic field between the two locations. This is could be implemented for speed sensors, for example, where the left and right field sensor are typically about 2.5 mm apart.

Figure 10:
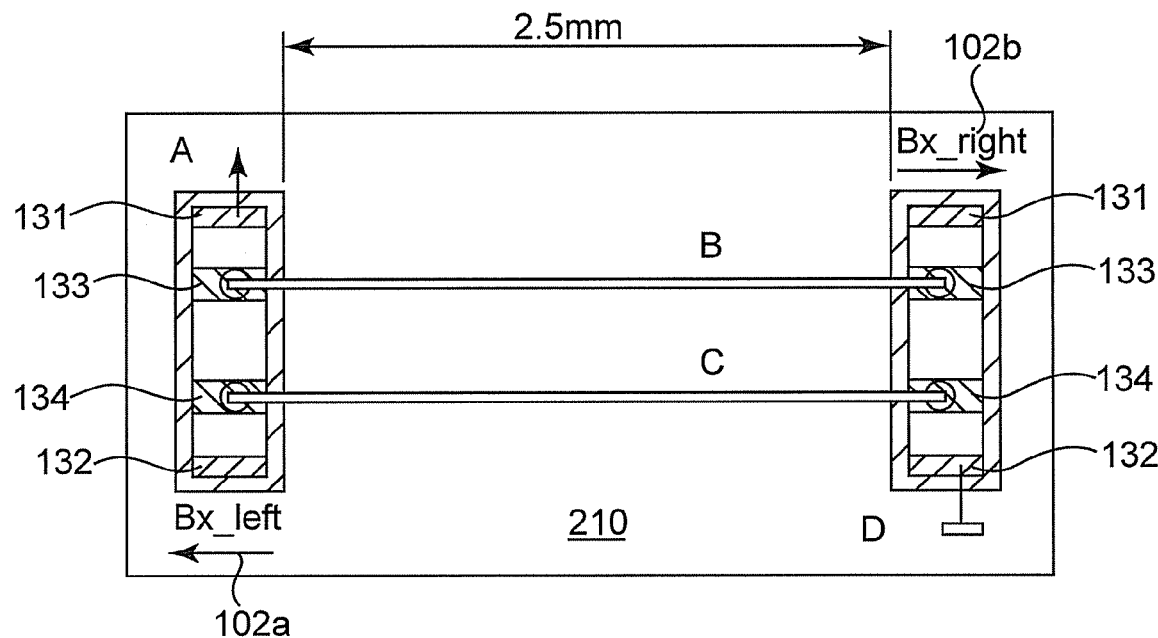
FIG. 10 is a schematic top view conceptually illustrating an embodiment of a Hall effect device.

It is also possible to use a single, modified Vertical Hall bridge to detect the differential field as with the embodiment illustrated in FIG. 10. In the embodiment illustrated in FIG. 10, the first and second Vertical Hall devices 200a, 200b are situated at opposite sides of a semiconductor die 210, separated by a distance of about 2.5 mm. The left and right magnetic field directions are indicated by arrows 102a and 102b, respectively.

In the case of a homogeneous magnetic field, the signal at the output terminals B and C would be the same, B=C. If the magnetic field 102a on the left sensor 200a points in the opposite direction than the magnetic field 102b on the right sensor 200b, then the difference between the signals at the output terminals B and C, (B-C) will be proportional to the difference between the two magnetic fields 102a, 102b.

Such a differential Vertical Hall bridge is useful in combination with a GMR bridge (giant magnetoresistor), for example, where the left GMRs are near the left sensor of the differential Vertical Hall bridge and the right GMRs are near the right sensor of the differential Vertical Hall bridge. At high magnetic fields the GMR goes into saturation, so it does not give a useful signal in response of a moving target wheel or permanent magnetic code wheel, for example. In this case, the differential Vertical Hall bridge can deliver a signal as a kind of emergency operating mode.

Figure 11:
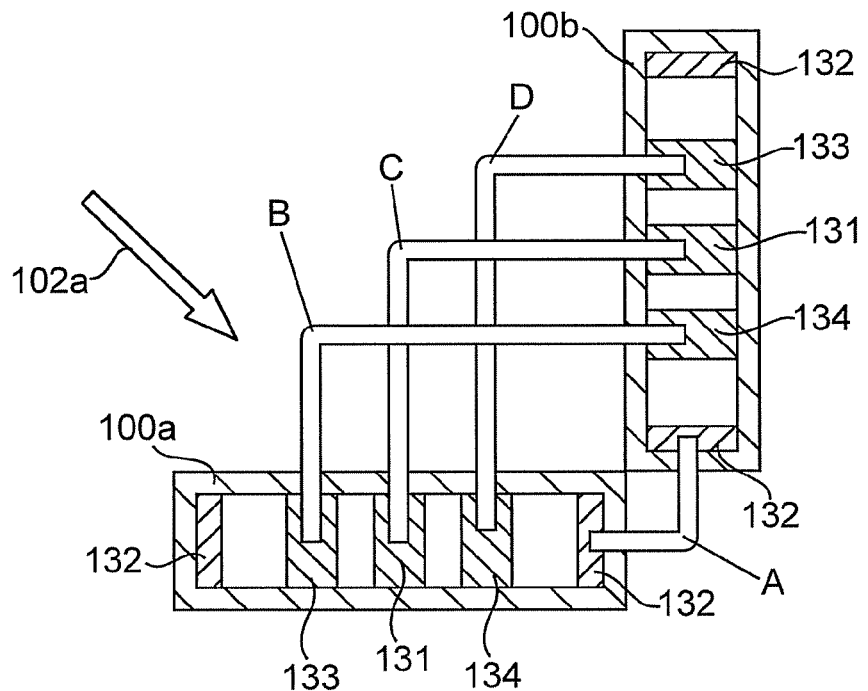
FIG. 11 is a schematic top view conceptually illustrating an embodiment of a Hall effect device.

FIG. 11 is a top view illustrating an embodiment including first and second Vertical Hall devices 100a, 100b as illustrated in FIGS. 1 and 2. The devices 100a, 100b are situated generally perpendicular to each other and connected in parallel, so the respective first and second terminals 131,132 are coupled to one another, and the third and fourth terminals 133,134 are cross-coupled to form terminals A-D as illustrated.

If electrical power is applied to terminals A and C, the voltage difference between terminals B and D is proportional to the strength of the magnetic field 102 with direction as illustrated by the arrow 102a. The Hall devices 300a, 300b are oriented perpendicularly to one another so that they react differently to mechanical stress on the die. The parallel connection averages the signals of both devices, thereby reducing unwanted effects caused by mechanical stress such as offset voltage and change of magnetic sensitivity due to mechanical stress.

Figure 12:
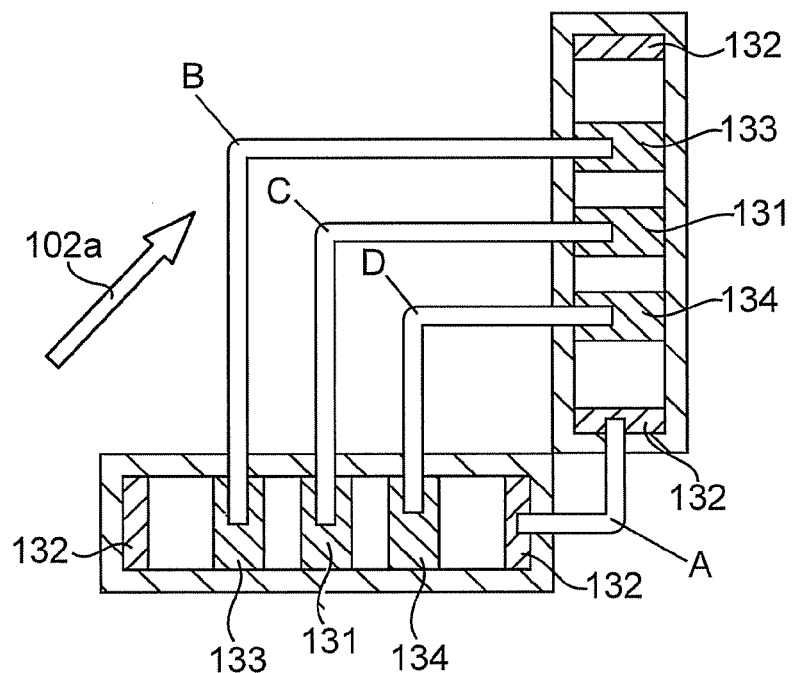
FIG. 12 is a schematic top view conceptually illustrating an embodiment of a Hall effect device.

FIG. 12 illustrates the device 300 with the terminals connected such that each of the third and fourth terminals 133, 134 of the devices 300a, 300b are connected to their respective counterparts. When connected in this manner, the voltage between terminals B and D is proportional to a magnetic field 102b perpendicular to the magnetic field 102a illustrated in FIG. 11. The contacts can be periodically switched the arrangements illustrated in FIGS. 11 and 12 to measure both components of the magnetic field 102a and 102b.

Figure 13:
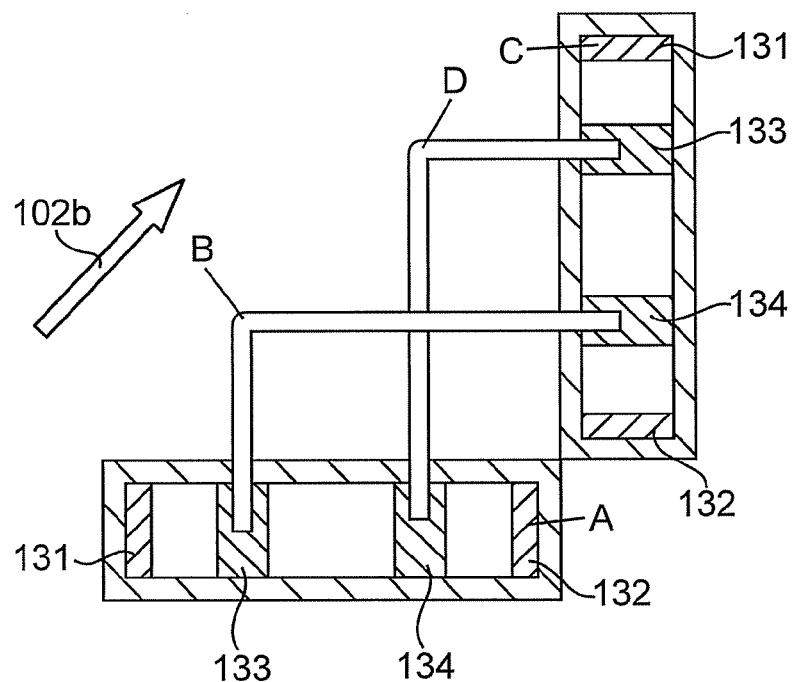
FIG. 13 is a schematic top view conceptually illustrating an embodiment of a Hall effect device.
Figure 14:
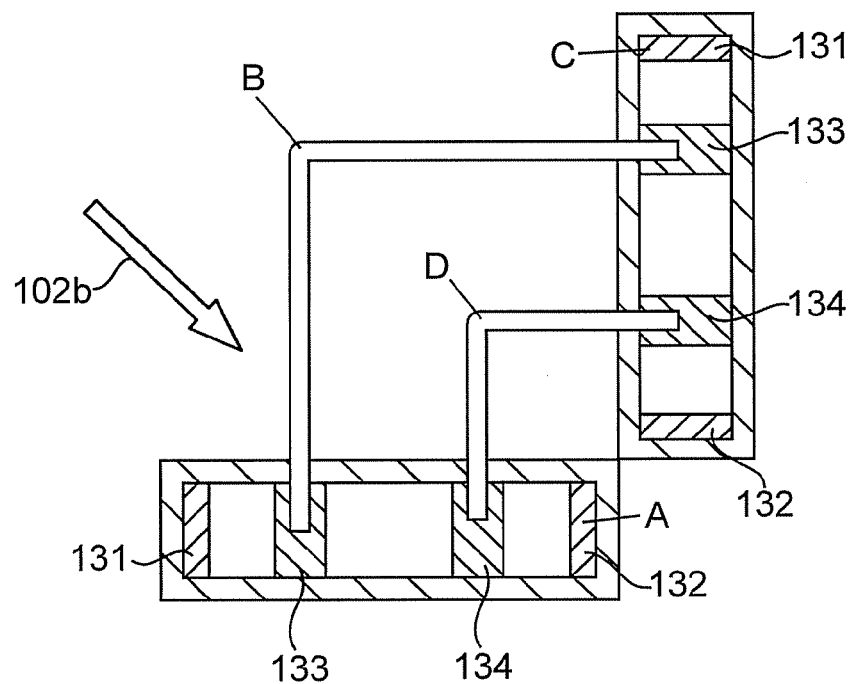
FIG. 14 is a schematic top view conceptually illustrating an embodiment of a Hall effect device.

FIGS. 13 and 14 illustrate similar arrangements of the Hall bridge devices 200 illustrated in FIGS. 4 and 5, with the Hall devices 200a and 200b situated generally perpendicular to each other. In FIG. 13, the third and fourth terminals 133, 134, which are configured as the output terminals B and D, are cross-connected, such that the third terminal 133 of the first device 200a is connected to the fourth terminal 134 of the second device 200b and vice versa. Thus, the voltage difference between terminals B and D is proportional to the magnetic field 102b. The connections of the third and fourth terminals 133, 134 are reversed in FIG. 14, so that the device measures the magnetic field 102a.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
 a Hall effect device, including:
 a substrate having a first conductivity type;
 an epitaxial layer having a second conductivity type defining a Hall effect portion;
 a conductive buried layer having the second conductivity type situated between the epitaxial layer and the substrate;
 first, second, third and fourth terminals;
 wherein the second terminal is coupled to the conductive buried layer by a conductive member; and
 an isolation structure between the third and fourth terminals and the conductive member.

2. The semiconductor device of claim 1, wherein the first conductivity type is p-type.

3. The semiconductor device of claim 1, wherein the second conductivity type is n-type.

4. The semiconductor device of claim 1, further comprising an isolation structure surrounding the Hall effect portion.

5. The semiconductor device of claim 1, wherein the second terminal comprises first and second ground terminals, and wherein the third and fourth terminals are output terminals situated on either side of the first terminal.

6. The semiconductor device of claim 1, wherein the Hall effect device includes first and second Hall effect devices, and wherein:
the first terminal of the first Hall effect device is coupled to the fourth terminal of the second Hall effect device;
the second terminal of the first Hall effect device is coupled to the third terminal of the second Hall effect device;
the third terminal of the first Hall effect device is coupled to the first terminal of the second Hall effect device; and
the fourth terminal of the first Hall effect device is coupled to the second terminal of the second Hall effect device.

7. The semiconductor device of claim 1, wherein the Hall effect device includes first and second Hall effect devices, and wherein:
the third terminal of the first Hall effect device is coupled to the fourth terminal of the second Hall effect device; and
the fourth terminal of the first Hall effect device is coupled to the third terminal of the second Hall effect device.

8. The semiconductor device of claim 7, wherein the first and second Hall effect devices are separated by an isolation structure.

9. The semiconductor device of claim 7, wherein the first and second Hall effect devices are situated perpendicular to one another.

10. The semiconductor device of claim 1, wherein the Hall effect device includes first and second Hall effect devices, and wherein:
the third terminal of the first Hall effect device is coupled to the third terminal of the second Hall effect device; and
the fourth terminal of the first Hall effect device is coupled to the fourth terminal of the second Hall effect device.

11. The semiconductor device of claim 10, wherein the first and second Hall effect devices are spaced apart from one another at opposite ends of a semiconductor die.

12. The semiconductor device of claim 10, wherein the first and second Hall effect devices are situated perpendicular to one another.

13. The semiconductor device of claim 1, wherein the Hall effect device includes a first Hall effect device and a second Hall effect situated generally perpendicular to the first Hall effect device, and wherein:
the first terminal of the first Hall effect device is coupled to the first terminal of the second Hall effect device;
the second terminal of the first Hall effect device is coupled to the second terminal of the second Hall effect device;
the third terminal of the first Hall effect device is coupled to the fourth terminal of the second Hall effect device; and
the fourth terminal of the first Hall effect device is coupled to the third terminal of the second Hall effect device.

14. A method of producing a Hall effect device, comprising:
providing a substrate having a first conductivity type;
providing an epitaxial layer having a second conductivity type defining a Hall effect portion;
providing a conductive buried layer having the second conductivity type between the epitaxial layer and the substrate;
coupling first and second terminals to the conductive buried layer via a conductive member;
coupling third and fourth terminals to the epitaxial layer; and
providing an isolation structure between the third and fourth terminals and the collector diffusion.

15. The method of claim 14, further comprising coupling an additional terminal to the epitaxial layer.

16. The method of claim 14, wherein coupling the third and fourth terminals to the epitaxial layer includes providing CMOS wells in the epitaxial layer.

17. The method of claim 14, wherein the conductive member comprises a collector diffusion.

18. A magnetic sensing method, comprising:
providing a first Hall effect device including a Hall effect portion and a conductive buried layer between the Hall effect portion and a substrate;
coupling a first terminal to the Hall effect portion;
coupling a second terminal to the conductive buried layer via a conductive member;
coupling third and fourth output terminals to the Hall effect portion on opposite sides of the first voltage terminal;
providing an isolation structure between the third and fourth terminals and the collector diffusion;
connecting the first and second terminals to first and second respective voltage potentials; and
determining the voltages at the third and fourth terminals in response to a magnetic field.

19. The method of claim 18, wherein one of the first or second voltage potentials is ground.

20. The method of claim 18, further comprising:
providing a second Hall effect device including a Hall effect portion and a conductive buried layer between the Hall effect portion and a substrate;
coupling the first terminal of the first Hall effect device to the fourth terminal of the second Hall effect device;
coupling the second terminal of the first Hall effect device to the third terminal of the second Hall effect device;
coupling the third terminal of the first Hall effect device to the first terminal of the second Hall effect device; and
coupling the fourth terminal of the first Hall effect device to the second terminal of the second Hall effect device.

21. The method of claim 20 wherein the first and second terminals of the first Hall effect device are connected to the first and second respective voltage potentials during a first clock phase and wherein the third and fourth terminals of the first Hall effect device are connected to the first and second respective voltage potentials during a second clock phase.

22. A magnetic sensing method, comprising:
providing first and second Hall effect devices, each including a Hall effect portion and a conductive buried layer between the Hall effect portion and a substrate with first and second terminals coupled to the conductive buried layer and third and fourth terminals coupled to the Hall effect portion;
coupling the third terminal of the first Hall effect device to the fourth terminal of the second Hall effect device;
coupling the fourth terminal of the first Hall effect device to the third terminal of the second Hall effect device;
connecting the first terminal of the first Hall effect device to a first voltage potential and the second terminal of the second Hall effect device to a second voltage potential; and
determining the voltages at the third and fourth terminals of the first Hall effect device in response to a magnetic field.

23. The method of claim 22, wherein the first and second Hall effect devices are separated by an isolation structure.

24. A semiconductor device, comprising:
first and second Hall effect devices, each including:
- a substrate having a first conductivity type;
- an epitaxial layer having a second conductivity type defining a Hall effect portion;
- a conductive buried layer having the second conductivity type situated between the epitaxial layer and the substrate; and
- first, second, third and fourth terminals;

wherein:
the second terminal is coupled to the conductive buried layer;
the first terminal of the first Hall effect device is coupled to the fourth terminal of the second Hall effect device;
the second terminal of the first Hall effect device is coupled to the third terminal of the second Hall effect device;
the third terminal of the first Hall effect device is coupled to the first terminal of the second Hall effect device; and
the fourth terminal of the first Hall effect device is coupled to the second terminal of the second Hall effect device.

25. A semiconductor device, comprising:
first and second Hall effect devices, each including:
- a substrate having a first conductivity type;
- an epitaxial layer having a second conductivity type defining a Hall effect portion;
- a conductive buried layer having the second conductivity type situated between the epitaxial layer and the substrate; and
- first, second, third and fourth terminals;

wherein:
the second terminal is coupled to the conductive buried layer;
the third terminal of the first Hall effect device is coupled to the fourth terminal of the second Hall effect device; and
the fourth terminal of the first Hall effect device is coupled to the third terminal of the second Hall effect device.

26. A semiconductor device, comprising:
first and second Hall effect devices, each including:
a substrate having a first conductivity type;
an epitaxial layer having a second conductivity type defining a Hall effect portion;
a conductive buried layer having the second conductivity type situated between the epitaxial layer and the substrate; and
first, second, third and fourth terminals;
  wherein:
  the second terminal is coupled to the conductive buried layer;
  the third terminal of the first Hall effect device is coupled to the third terminal of the second Hall effect device; and
  the fourth terminal of the first Hall effect device is coupled to the fourth terminal of the second Hall effect device.

27. A semiconductor device, comprising:
a first Hall effect device;
a second Hall effect device situated generally perpendicular to the first Hall effect device;
the first and second Hall effect devices including:
a substrate having a first conductivity type;
an epitaxial layer having a second conductivity type defining a Hall effect portion;
a conductive buried layer having the second conductivity type situated between the epitaxial layer and the substrate; and
first, second, third and fourth terminals;
wherein:
the second terminal is coupled to the conductive buried layer;
the first terminal of the first Hall effect device is coupled to the first terminal of the second Hall effect device;
the second terminal of the first Hall effect device is coupled to the second terminal of the second Hall effect device;
the third terminal of the first Hall effect device is coupled to the fourth terminal of the second Hall effect device; and
the fourth terminal of the first Hall effect device is coupled to the third terminal of the second Hall effect device.

28. A magnetic sensing method, comprising:
providing first and second Hall effect devices, each including a Hall effect portion and a conductive buried layer between the Hall effect portion and a substrate;
configuring the first and second Hall effect devices such that they are symmetric, the configuring comprising at least:
coupling a first terminal to the Hall effect portion;
coupling a second terminal to the conductive buried layer;
coupling third and fourth output terminals to the Hall effect portion on opposite sides of the first voltage terminal; and
connecting the first and second terminals to first and second respective voltage potentials;
connecting the first and second Hall effect devices, the connecting of which comprises:
coupling the first terminal of the first Hall effect device to the fourth terminal of the second Hall effect device;
coupling the second terminal of the first Hall effect device to the third terminal of the second Hall effect device;
coupling the third terminal of the first Hall effect device to the first terminal of the second Hall effect device;
coupling the fourth terminal of the first Hall effect device to the second terminal of the second Hall effect device; and
determining the voltages at the third and fourth terminals in response to a magnetic field.

* * * * *